US012571838B2

(12) United States Patent
Vettori et al.

(10) Patent No.: US 12,571,838 B2
(45) Date of Patent: Mar. 10, 2026

(54) PROBE HEAD FOR TESTING ELECTRONIC DEVICES COMPRISING INTEGRATED OPTICAL ELEMENTS

(71) Applicant: TECHNOPROBE S.P.A., Cernusco Lombardone (IT)

(72) Inventors: Riccardo Vettori, Cernusco Lombardone (IT); Roberto Crippa, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 270 days.

(21) Appl. No.: 18/042,159

(22) PCT Filed: Aug. 23, 2021

(86) PCT No.: PCT/EP2021/073260
§ 371 (c)(1),
(2) Date: Feb. 17, 2023

(87) PCT Pub. No.: WO2022/043257
PCT Pub. Date: Mar. 3, 2022

(65) Prior Publication Data
US 2023/0305054 A1     Sep. 28, 2023

(30) Foreign Application Priority Data
Aug. 25, 2020    (IT) ......................... 102020000020407

(51) Int. Cl.
*G01R 31/28*          (2006.01)
*G01R 1/02*           (2006.01)
(Continued)

(52) U.S. Cl.
CPC ..... *G01R 31/2887* (2013.01); *G01R 31/2891* (2013.01)

(58) Field of Classification Search
CPC ........ G01R 31/02; G01R 31/26; G01R 31/28; G01R 31/44; G01R 1/02; G01R 1/04; G01R 1/067; G01R 1/073; G01R 19/00
See application file for complete search history.

(56) References Cited

U.S. PATENT DOCUMENTS

| | | | |
|---|---|---|---|
| 5,631,571 A | 5/1997 | Spaziani et al. | |
| 7,024,066 B1 * | 4/2006 | Malendevich | ......... G02B 6/122 385/11 |

(Continued)

FOREIGN PATENT DOCUMENTS

| | | |
|---|---|---|
| CN | 111123072 A | 5/2020 |
| CN | 113272661 A | 8/2021 |

(Continued)

OTHER PUBLICATIONS

International Search Report and Written Opinion for Corresponding International Application No. PCT/EP2021/073260 (12 Pages) (Oct. 1, 2021).

*Primary Examiner* — Neel D Shah
(74) *Attorney, Agent, or Firm* — LUCAS & MERCANTI, LLP

(57) ABSTRACT

A probe head for a testing apparatus of electronic devices is disclosed having a plurality of contact probes, a guide provided with a plurality of guide holes for slidingly housing the contact probes, and a containment element which is adapted to support the guide. The containment element includes a first portion and a second portion which is movable with respect to the first portion, movement means adapted to move the second portion of the containment element with respect to the first portion, and a test optical signal distribution element configured to transmit a test optical signal to the device under test. The test optical signal distribution element is associated with the second portion of the containment element and is arranged to be moved (Continued)

integrally therewith. The movement means is configured to allow the alignment of the test optical signal distribution element.

19 Claims, 16 Drawing Sheets

(51) Int. Cl.

| | | |
|---|---|---|
| *G01R 1/04* | (2006.01) | |
| *G01R 1/067* | (2006.01) | |
| *G01R 1/073* | (2006.01) | |
| *G01R 19/00* | (2006.01) | |
| *G01R 31/02* | (2006.01) | |
| *G01R 31/26* | (2020.01) | |
| *G01R 31/44* | (2020.01) | |

(56) References Cited

U.S. PATENT DOCUMENTS

| | | | |
|---|---|---|---|
| 2007/0268483 A1 | 11/2007 | Yatsugake et al. | |
| 2011/0279812 A1* | 11/2011 | Masuda | G01R 31/2886 |
| | | | 356/123 |
| 2014/0203830 A1 | 7/2014 | Shin et al. | |
| 2019/0056458 A1* | 2/2019 | Arai | G01R 31/2635 |
| 2019/0064218 A1 | 2/2019 | Tsuji | |
| 2020/0110131 A1 | 4/2020 | Chuang et al. | |

FOREIGN PATENT DOCUMENTS

| | | |
|---|---|---|
| JP | H1056047 A | 2/1998 |
| WO | 2018019866 A1 | 2/2018 |
| WO | 2019029765 A1 | 2/2019 |
| WO | 2019230410 A1 | 12/2019 |

* cited by examiner

PROBE HEAD FOR TESTING ELECTRONIC DEVICES COMPRISING INTEGRATED OPTICAL ELEMENTS

CROSS-REFERENCE TO RELATED APPLICATIONS

This application is a 371 of PCT/EP2021/073260, filed Aug. 23, 2021, which claims the benefit of Italian Patent Application No. 102020000020407, filed Aug. 25, 2020.

TECHNICAL FIELD

The present invention relates to a probe head for testing electronic devices comprising integrated optical elements, such as for example electronic devices integrated in a semiconductor wafer and also including integrated photonic circuits, and the following description is made with reference to this field of application with the sole purpose of simplifying the exposition thereof.

BACKGROUND ART

As well knows, a probe head is essentially a device adapted to electrically connect a plurality of contact pads of a microstructure, in particular an electronic device integrated on a semiconductor wafer, with corresponding channels of a testing apparatus which carries out the functionality check thereof, in particular electric, or generically the test.

The test carried out on integrated circuits in particular serves to detect and isolate defected circuits already in the production step. Normally, the probe heads are then used for electrically testing the circuits integrated on wafer before cutting and mounting thereof inside a chip containment package.

A probe head usually comprises a plurality of movable contact probes held by at least one pair of supports or guides which are substantially plate-shaped and parallel to each other. Said plate-shaped supports being provided with specific holes and are placed at a certain distance between each other so as to leave a free zone or an air zone for moving and possibly deforming the contact probes, which are normally formed by special alloy wires with good electric and mechanical properties.

The good connection between the contact probes and the contact pads of the device under test is ensured by the pressure of the probe head on the same device, the contact probes, which are movable within the guide holes and formed in the guides, being subjected, during said pressing contact, to a flexion inside the air zone and a sliding inside said guide holes. Probe heads of this type are commonly called vertical probe heads.

In some cases, the contact probes are secured to the same head at the upper plate-shaped support in a fixed manner: in this case, they are called probe heads with blocked probes. However, more often, probe heads are used having probes which are not blocked in a fixed manner but are kept interfaced with a so-called board, possibly by a microcontacter: they are called probe heads with non-blocked probes. The microcontacter is usually called "space transformer" since, in addition to the contact with the probes, it allows also to spatially redistribute the contact pads formed thereon, with respect to the contact pads on the device under test, in particular with a loosening of the distance constraints between the centres of the same pads.

In the last years, there has been a considerable development of the so-called integrated photonic circuits (PIC, from "Photonic Integrated Circuits"), where it is possible to obtain extremely high (in the order of THz) data transmission speeds with dissipated power lower with respect to the electronic traditional technology. The development of this technology is particularly driven by the need of integrating fast transmission lines between electronic devices, as well as between elements inside the same devices.

In order to integrate the optical transmission means in electronic chips, the confinement of the light and the transmission thereof occur by taking advantage of the silicon combined with substrates formed starting from materials such as oxides or other dielectrics having lower refraction indices, thus forming integrated waveguides. The waveguides on silicon can have dimensions smaller than micron and are thus easily integrable in a chip, such that it is possible to integrate optical and electric components inside a CMOS component, creating faster devices, with much higher computing powers and with higher performances from an energetic point of view.

A problem of these devices is due to the coupling of the light in the waveguide of the chip, which can be observed also in the test step thereof.

In particular, in order to test devices comprising electronic components and at the same time integrated optical components, it is necessary to at the same time obtain the optical coupling between the light signal coming from testing apparatus and the waveguides of the device under test on one side, and the traditional electric and mechanical contact by the contact probes on the other side.

In fact, in accordance with the known solutions, the contact probes contact the contact pads of the device under test and feed it via power and ground probes in order to check the electric operation of said device via signal probes. Furthermore, in the systems comprising integrated photonic circuits, the chips have input/output optical interfaces and, for testing said components, it is necessary to couple the light in the waveguides via said optical interfaces and detect the outgoing light, as schematically indicated in FIG. 1. In particular, in FIG. 1, a probe head 1 is able to send electronic signals 2a (via traditional contact probes which are not illustrated) and optical signals 2b (via optical elements—in general waveguides—which are also not illustrated) to a device under test 3, which comprises traditional contact pads 4a for electrically coupling and optical interfaces 4b for optically coupling the light signal coming from the probe head 1.

In general, the test of the device under test begins with an optical alignment routine wherein some circular movements (indicated in the sector as "spiral" movements) of the waveguides of the probe head are carried out, while the quality of the optical coupling is continuously checked, in particular the value of the coupled optical power in the device. When the signal power reaches a target value, the test may begin. The accuracy requested for this type of procedure is of about ±100 nm.

In accordance with some known solutions, probe heads can be coupled to external mechanical systems, such as movable mechanical arms on which an array of waveguides (for example optical fibres) intended for the optical test of the device. These probe heads are usually provided with contact probes of the cantilever type. Said probe heads must then provide a free space for moving the arm carrying the waveguides, thus increasing the bulks.

It is in general difficult to ensure in a simple way the alignment of the waveguides with the optical interfaces of the device under test, which, in the known solutions, can be obtained with complicated dynamics.

The relative alignment between the optical components and the electric contact probes inside the probe head should also be ensured, for example the relative alignment in a plane parallel to the plane in which the device under test lays (for example the plane x-y of the reference system of the figures), in which an accuracy of at least 100 nm is required.

It is finally important to also ensure the precise vertical positioning (that is along the axis z of the reference system of the figures) of the optical elements of the probe head.

The technical problem of the present invention is to devise a probe head having functional and structural features so as to allow to overcome the limitations and drawbacks which still affect the probe heads made according to the prior art, in particular which is able to allow a simple and stable alignment of the optical components integrated therein, without complicating the structure of the head and at the same time maintaining high performances. In particular, a simple integration of the optical and electric part is desired to be obtained in order to avoid coupling the probe head with external mechanical systems and to allow the electric/optical test of more devices in parallel.

SUMMARY OF INVENTION

The solution idea underlying the present invention is to provide a probe head with vertical probes comprising a pair of guides between which a containment element (also called housing) of the vertical probes is arranged, wherein the vertical probe head technology is combined with the presence of optical elements, in particular waveguides, inside the probe head, in particular associated with the lower guide, for carrying out the tests of devices including integrated photonic devices, wherein the optical elements are integrated inside the probe head forming a simple and compact structure. In particular, the containment element is provided with a fixed portion (for example an external frame) and a movable portion (for example the central core) to which at least the waveguides for the optical test are connected via a designated ceramic support and simple movement means, such as piezoelectric transducers, are present for moving said movable portion and obtain a fine and precise alignment of the optical elements with respect to the optical interfaces of the device under test. In this way, both the contact probes and the waveguides are associated with a same containment element of the probe head, wherein the movement only of the movable portion of the containment element is required for obtaining the optical alignment, obtaining a structure which is compact and allows the use of vertical probes housed in the guides and in the containment element. The designed architecture furthermore allows a simple relative alignment between the contact probes and optical elements, by simply moving the ceramic support of the waveguides, as well as a simple adjustment of the distance in the vertical direction.

It is therefore possible to test optoelectronic devices via vertical probes, without the aid of complicated and expensive precision mechanics.

Based on such solution idea, the above-mentioned technical problem is solved by a probe head for a testing apparatus of electric devices, comprising a plurality of contact probes adapted to electrically and mechanically contact contact pads of a device under test, at least one guide provided with a plurality of guide holes for slidingly housing the contact probes, a containment element which is adapted to support the guide and houses at least one portion of the contact probes, wherein said containment element comprises a first portion and a second portion which is movable with respect to the first portion, movement means adapted to move the second portion of the containment element with respect to the first portion, and at least one test optical signal distribution element configured to transmit a test optical signal to the device under test, wherein the test optical signal distribution element is associated to the second portion of the containment element and is arranged to be moved integrally therewith by means of the movement means, said movements means being configured to allow the alignment of the test optical signal distribution element.

More in particular, the invention comprises the following additional and optional characteristics, singularly taken or in combination if necessary.

According to an aspect of the present invention, the guide can be structured as a first guide portion, which is connected to the first portion of the containment element, and a second guide portion, which is connected to the second portion of the containment element and is configured to move together with said second portion of said containment element.

According to an aspect of the present invention, the contact probes can be associated with the first portion of the containment element, said contact probes being configured to be stationary during the movement of the second portion of said containment element.

More in particular, the contact probes can be associated with the first portion of the containment element through the first guide portion (in particular are housed in the guide holes formed in said first guide portion), and the test optical signal distribution element can be associated (connected) with the second portion of said containment element through the second guide portion.

According to another aspect of the present invention, the contact probes can also be associated with the second portion of the containment element and can be arranged to move integrally with said second portion and with the test optical signal distribution element.

More in particular, the second guide portion can in turn comprise a first guide structure, which includes the guide holes for housing the contact probes, and a second guide structure adapted to house the test optical signal distribution element, said second guide structure being structurally independent from the first guide structure.

The test optical signal distribution element can also be directly connected to the first portion of the containment element.

According to an aspect of the present invention, the movement means can comprise at least two piezoelectric transducers, each of said piezoelectric transducers being configured to cause a linear movement of the second portion of the containment element in a specific space direction.

Furthermore, the contact probes can comprise a body extending vertically along a longitudinal axis between a first end and a second and opposite end. The first end can be for example adapted to contact an interface board interfaced with the probe head, and the second end can be adapted to contact the contact pads of the device under test.

According to another aspect of the present invention, the test optical signal distribution element can be connected to the guide of the probe head, for example to a face of the guide facing the device under test. In particular, it can be glued to the face of the guide.

According to another aspect of the present invention, the above-mentioned guide can be a lower guide, and the probe head can further comprise an upper guide, wherein the containment element is arranged between the lower guide and the upper guide.

According to another aspect of the present invention, the test optical signal distribution element can comprise first alignment holes, the second guide portion of the lower guide can comprise second alignment holes and the upper guide can comprise third alignment holes, said alignment holes being arranged and configured to allow, when the centers of the alignment holes of the test optical signal distribution element are aligned along a respective predetermined axis with centers of corresponding alignment holes of the second guide portion and with centers of corresponding alignment holes of the upper guide, the passage of alignment pins to ensure reciprocal alignment between the contact probes and the test optical signal distribution element connected to the second guide portion of the lower guide.

According to an aspect of the present invention, the alignment holes can be obtained by laser drilling with accuracy less than 3 μm.

Furthermore, the upper guide can be made of a single piece.

According to still another aspect of the present invention, the test optical signal distribution element can comprise a glass or plastic body and a plurality of waveguides which are formed in said glass or plastic body and are configured to guide light from a light source towards the device under test.

According to still another aspect of the present invention, the test optical signal distribution element can be configured to couple light via a grating coupler of an optical interface of the device under test.

According to still another aspect of the present invention, the probe head of the present invention can comprise at least one spacer element arranged between the containment element and the guide (for example between the containment element and the second guide structure), said spacer element being removable to allow adjusting the distance between said test optical signal distribution element and the device under test.

Furthermore, the containment element can comprise at least one deformable arm which connects its first portion and its second movable portion to each other.

Finally, the first portion of the containment element can be a peripheral portion thereof, and the second portion of said containment element can be a central portion thereof.

The characteristic and advantages of the probe head according to the invention will result from the description, made below, of an embodiment thereof given by way of a non-limiting example with reference to the attached drawings.

DETAILED DESCRIPTION OF THE INVENTION

With reference to such figures, a probe head made according to the present invention is globally and schematically indicated with 10.

It should be noted that the figures represent schematic views and are not drawn to scale, but they are instead drawn so as to emphasize the important characteristics of the invention. Furthermore, in the figures, different elements are represented in a schematic way, their form can vary according to the desired application. It should furthermore be noted that identical reference numbers in the figures refer to identical elements in form or function. Finally, particular improvements described in relation to an embodiment illustrated in a figure can be used also for other embodiments illustrated in the other figures.

As will be described in the following, in the more general form thereof, the probe head 10 is adapted to connect with a testing apparatus (not shown in the figures) for carrying out the test of integrated electronic devices on a semiconductor wafer, said electronic devices comprising also integrated optical elements such as photonic chips, and it is therefore provided with optical components designated for said test. A probe head of this type is also called optoelectronic probe head.

Figure 1:
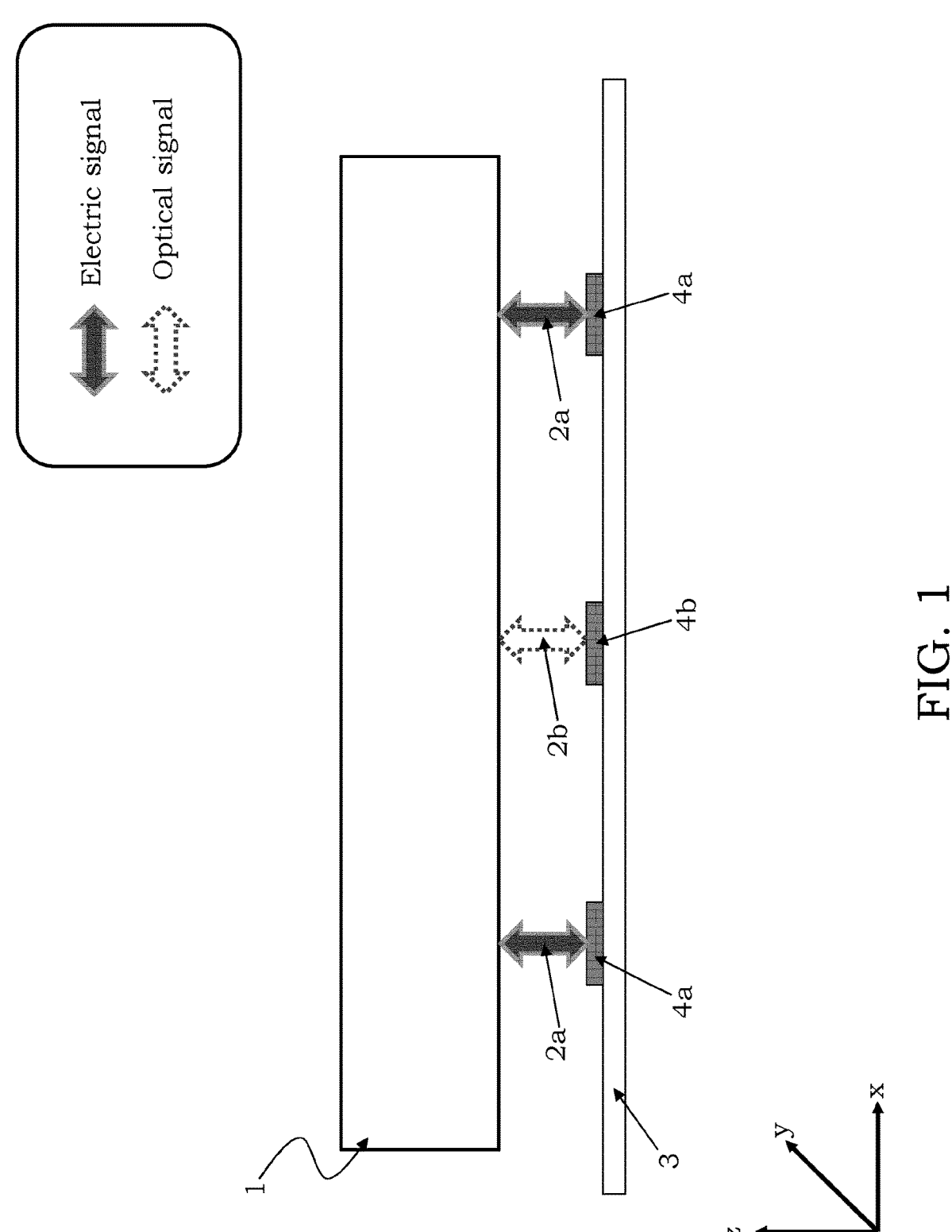
FIG. 1 schematically shows an optoelectronic probe head for testing an electronic device including integrated optical components.
Figure 2A:
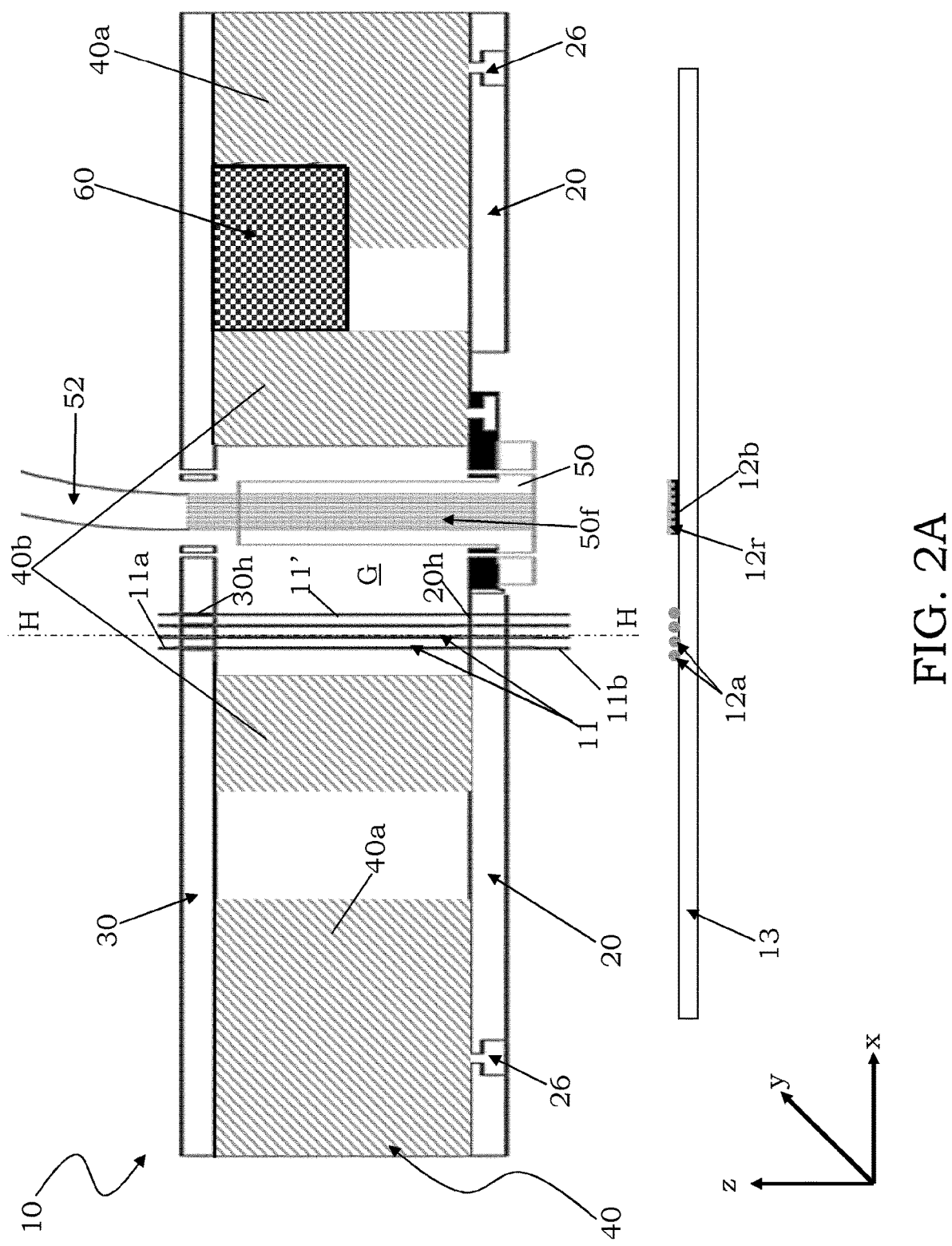
FIGS. 2A and 2B schematically show a probe head according to embodiments of the present invention.
Figure 2B:
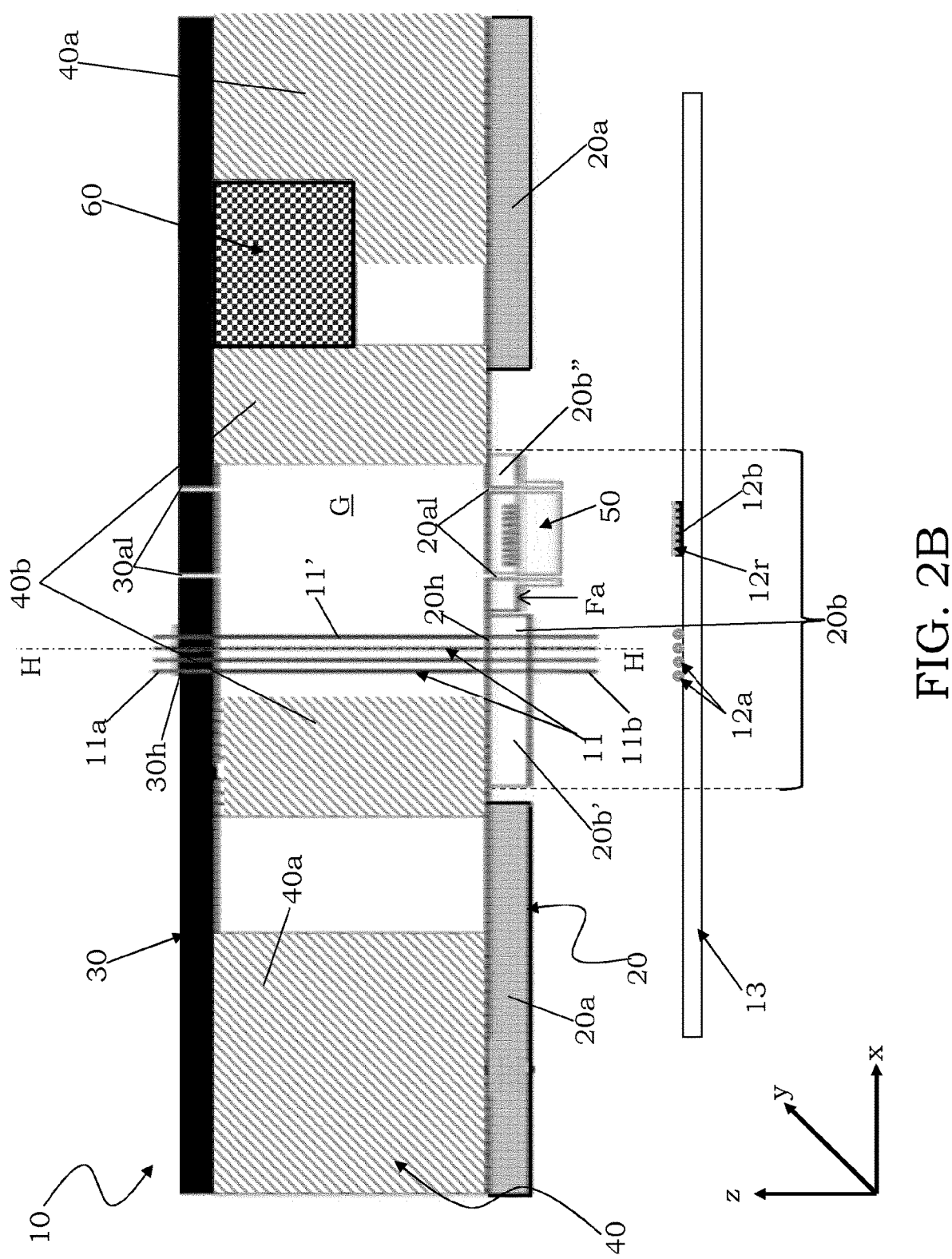

As illustrated in FIGS. 2A and 2B, the probe head 10 comprises a plurality of contact probes 11 adapted to electrically and mechanically contact contact pads 12a of a device under test 13. The contact probes 11 are then the elements designated to carry out the electric test of the device under test 13 and, as known in the sector, they can be divided in ground probes, power probes and probes designated to transport operational signals I/O towards/from said device under test 13.

In particular, the contact probes 11 comprise a body 11' vertically extending along a longitudinal axis H-H between a first end 11a and a second and opposite end 11b. The first end 11a can be adapted to contact an interface board (not illustrated in the figures) interfaced with the probe head 10, such as for example a interposer or a printed circuit board (PCB), while the second end 11b is adapted to contact the contact pads 12a of the device under test 13.

In other words, according to the present invention, the contact probes 11 are vertical probes, having for example a substantially vertical body 11' which is able to flex when in contact with the device under test 13, the probe head 10 being therefore a vertical probe head.

The probe head 10 thus comprises at least one guide 20 provided with a plurality of guide holes 20h for slidingly housing the contact probes 11. By way of example, the guide 20 can be made of a ceramic material, as known in the field.

In an embodiment of the present invention, the guide 20 is a lower guide and the probe head 10 further comprises an upper guide 30, also provided with guide holes 30h corresponding to guide holes 20h for slidingly housing the vertical contact probes 11.

In order to carry out the optical test of the optical components integrated in the device under test 13, the probe head 10 comprises at least one test optical signal distribution element 50 configured to transmit a test optical signal to said device under test 13. As will be specified in the following, in an embodiment of the present invention, the test optical signal distribution element 50 is connected to the lower guide 20.

It can be immediately observed that the particular form of the test optical signal distribution element 50 is not a limiting factor in the protection scope of the present invention and that said optical signal distribution element 50 can be associated with the lower guide 20 in different ways.

Specifically, the test optical signal distribution element 50 is a waveguide, in particular comprises a plurality of waveguides configured to transmit the test light signal from the testing apparatus (not illustrated in the figures) to the device under test 13.

For example, as illustrated in FIG. 2A, the test optical signal distribution element 50 may comprise an array of optical fibres 50f aligned and ending with the end of the same fibres at the face of said test optical signal distribution element 50 facing the device under test 13. In this case, the test optical signal distribution element 50 can vertically extend inside the probe head, that is along a vertical axis substantially parallel to the axis z of the reference system of the figures, thereby following the extension of the optical fibres 50f.

In the embodiment of FIG. 2B, the test optical signal distribution element 50 instead has a substantially horizontal extension and can comprise a body made of a plastic or glass material, having channels thereinside with index of refraction modified with respect to the same material, thus forming paths designated for transmitting light (which also ensures an excellent positioning accuracy), as will be also detailed in the following. Also many other suitable configurations are however possible, what matters is that the test optical signal distribution element 50 is configured to transmit the light signal from the probe head 10 towards the device under test 13, in particular towards optical interfaces 12b thereof.

Figure 3:
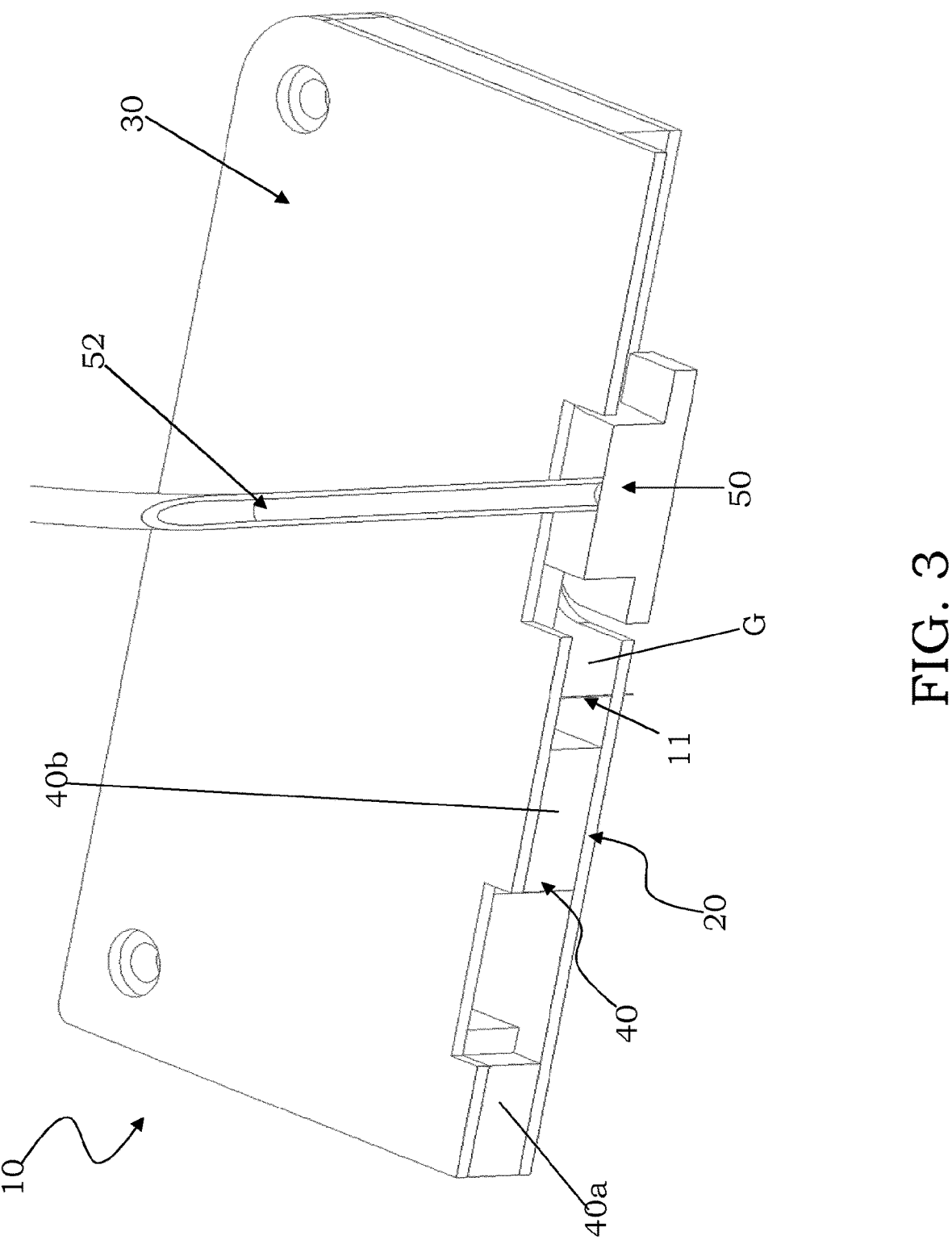
FIG. 3 shows a sectional prospective view of the probe head of the present invention.

Referring now to FIGS. 2A and 2B, the probe head 10 comprises a containment element or housing 40 adapted to support the lower guide 20 and the upper guide 30. In particular, the containment element 40 is arranged between the lower guide 20 and the upper guide 30. As can be seen in FIGS. 2A, 2B and 3, the containment element 40 houses at least one portion of the contact probes 11, and provides a rigid support structure of the probe head 10 as a whole.

The containment element 40 thus acts as support element of the probe head 10, and the lower guide 20, as well as the upper guide 30, is associated thereto.

According to the present invention, the containment element 40 comprises a first portion 40a and a second portion 40b, which can be moved with respect to the first portion 40a.

Figure 4:
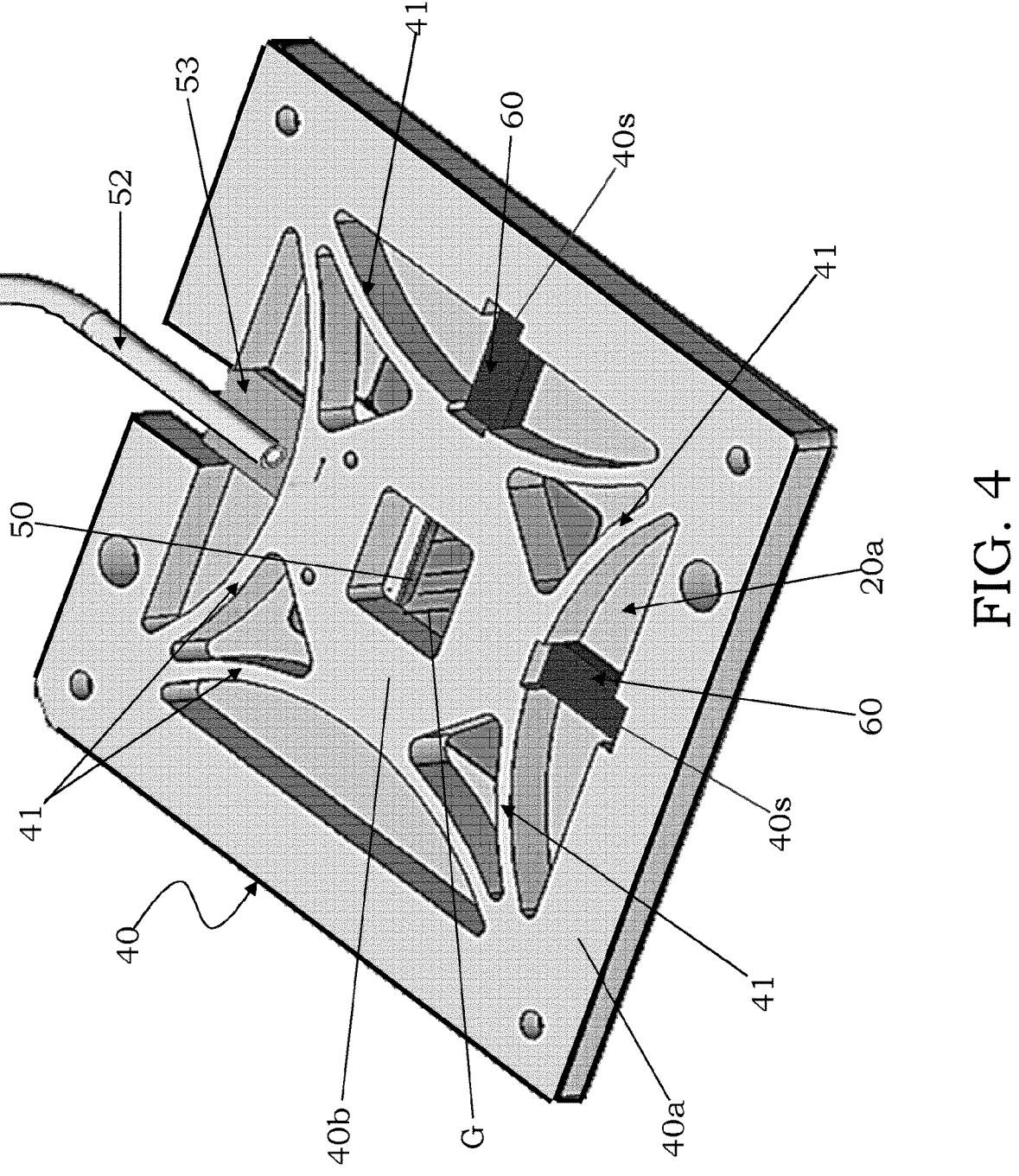
FIG. 4 shows a prospective view of components of the probe head of the present invention, in particular of a containment element and of components associated thereto.

In an embodiment of the present invention, as for example illustrated in FIG. 4, the containment element 40 comprises at least one deformable arm 41 which connects the first portion 40a and the second portion 40b to each other. For example, in a non-limiting embodiment of the present invention, deformable arms 41 can be provided at four vertices of the containment element 40 and configured to connect the first portion 40a to the second portion 40b. For example, eight arms 41 can be provided, two for each vertex, said arms extending in pairs from the vertices and being separated by an empty space. The arms 41 are shaped to be flexible, wherein the form of said arms 41 allows to carry out the desired movements of the second portion 40b of the containment element 40 with respect to the first portion 40a, as will be described in the following.

In an embodiment of the present invention, the containment element 40 has an overall substantially rectangular form and the first portion 40a is the fixed external frame thereof (that is it is a fixed peripheral portion) and the second portion 40b is the movable central part thereof.

Figure 5:
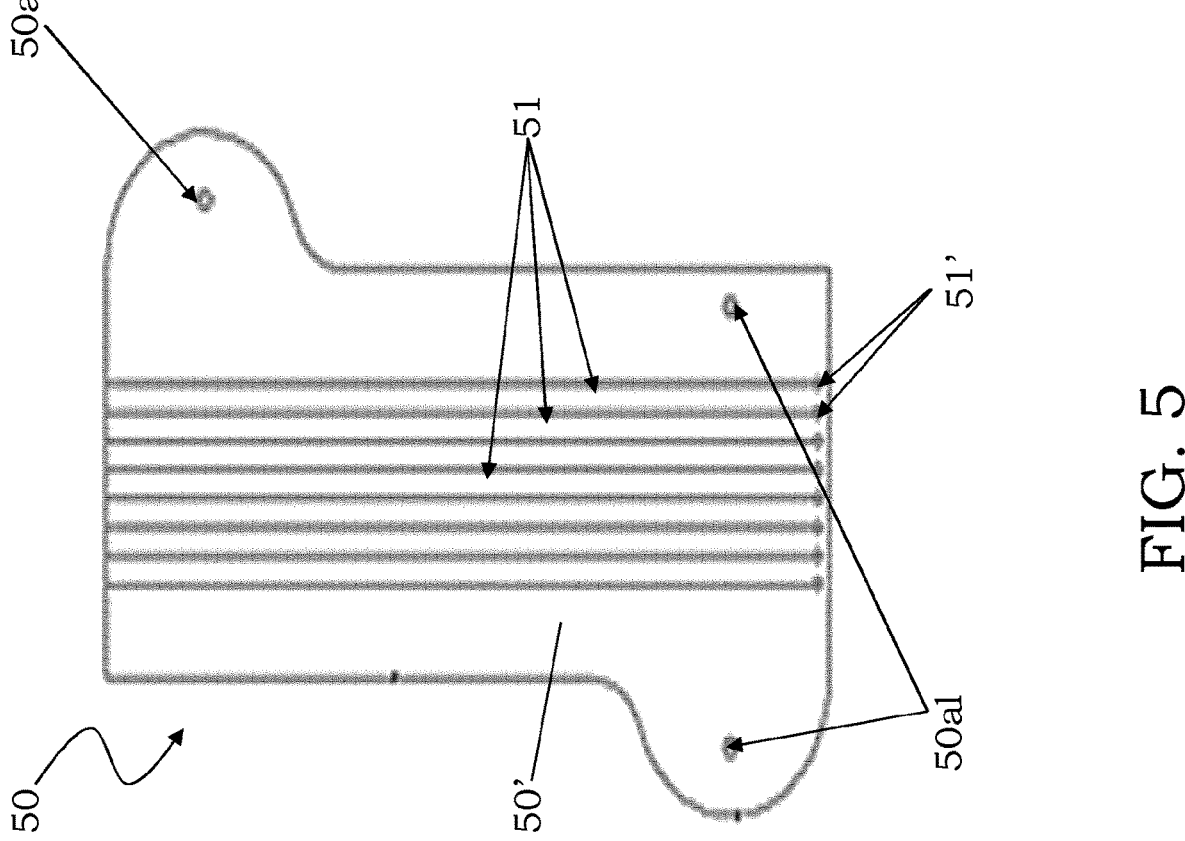
FIG. 5 shows a schematic view of the test optical signal distribution element according to an exemplary embodiment of the present invention.

As mentioned above, in an embodiment of the present invention represented in FIG. 5, the test optical signal distribution element 50 comprises a body 50', for example made of a glass material or plastic material, and a plurality of waveguides 51 which are formed in said body 50' and are configured to guide light from a light source towards the device under test 13. The waveguides 51 end in terminals 51' from which a suitable light beam is emitted towards the optical interfaces 12b of the device under test 13. The test optical signal distribution element 50 has a design configured to facilitate the integration and alignment thereof inside the probe head 10, in particular its connection to the guide 20.

By way of example, the thickness of the test optical signal distribution element 50 can vary from 0.5 mm to 3 mm, said thickness not being however limited to a particular value. As mentioned above, also the form of the test optical signal distribution element 50 can vary according to the needs and/or circumstances, for example based on the position of the optical interfaces 12b and/or of the electric contact pads 12a of the device under test 13, so that the form represented in the figures is purely indicative and non-limiting of the scope of the present invention.

Furthermore, means configured to transmit the light signal from the testing apparatus to the test optical signal distribution element 50 are provided, such as for example a cable 52 which connects said testing apparatus to said test optical signal distribution element 50, said cable 52 comprising optical fibres therein and possibly also cables adapted to transport electric signals. In an embodiment, the test optical signal distribution element 50 is connected to a component 53, which comprises means for connecting to the optical fibres of the cable 52, as well as electronic means (such as a PCB board) for connecting and managing the electric cables coming from said cable 52.

In an embodiment of the present invention, the test optical signal distribution element 50 is configured to couple light via a grating coupler of the device under test 13. In this case, the optical interface 12b of the device under test 13 comprises a grating 12r configured to channel the incident light in a waveguide of the device under test 13. During the test, the waveguides of the test optical signal distribution element 50 surmount said grating 12r, as schematically illustrated in FIGS. 2A and 2B, to which reference is now again made. This optical coupling configuration is advantageous since it allows a test directly on wafer without the need of singulating the single devices integrated on said wafer.

It can be however observed that the present invention is not limited by the structure and the specific operation of the test optical signal distribution element 50, which can be any structure of waveguide adapted to couple light in the device under test according to any suitable configuration, according to the needs and/or circumstances. Similarly, the present invention is not limited by a particular optical coupling mode with the device under test.

Advantageously, according to the present invention, in order to obtain the desired optical alignment, the test optical signal distribution element 50 is associated to the second portion 40*b* of the containment element 40 and is arranged to be moved integrally therewith.

It can be observed that, in the context of the present invention, the term "associated" means that the test optical signal distribution element 50 is physically put into relation with the containment element 40, for example connected according to any suitable mode, and not necessarily directly connected thereto, but for example indirectly connected via further components of the probe head 10.

Even more particularly, suitably, in order to allow the optical coupling of the light emitted by the test optical signal distribution element 50 associated with the second portion 40*b* of the containment element 40, the probe head 10 comprises movement means 60 adapted to move said second portion 40*b* with respect to the first portion 40*a* thereof.

In this way, the movement means 60 are configured to move the test optical signal distribution element 50 (via the movement of the second portion 40*b*) and thus to allow the alignment of said test optical signal distribution element 50 with respect to the optical interfaces 12*b* of the device under test 13, in particular an alignment at least in the plane x-y according to the reference of the figures, that is in a plane parallel to the plane in which said device under test 13 lays.

Referring again to FIG. 4, in an embodiment of the present invention, the movement means 60 are arranged in specific housing seats 40*s* formed in the first portion 40*a* of the containment element 40.

Thank to this architecture, it is possible to obtain, in a simple way, a stable alignment of the light emitted by the test optical signal distribution element 50 with regards to the optical interface 12*b* of the device under test 13.

In a preferred embodiment of the present invention, the test optical signal distribution element 50 is connected to the lower guide 20, and it is then associated with the containment element 40 via said lower guide 20.

Figure 6:
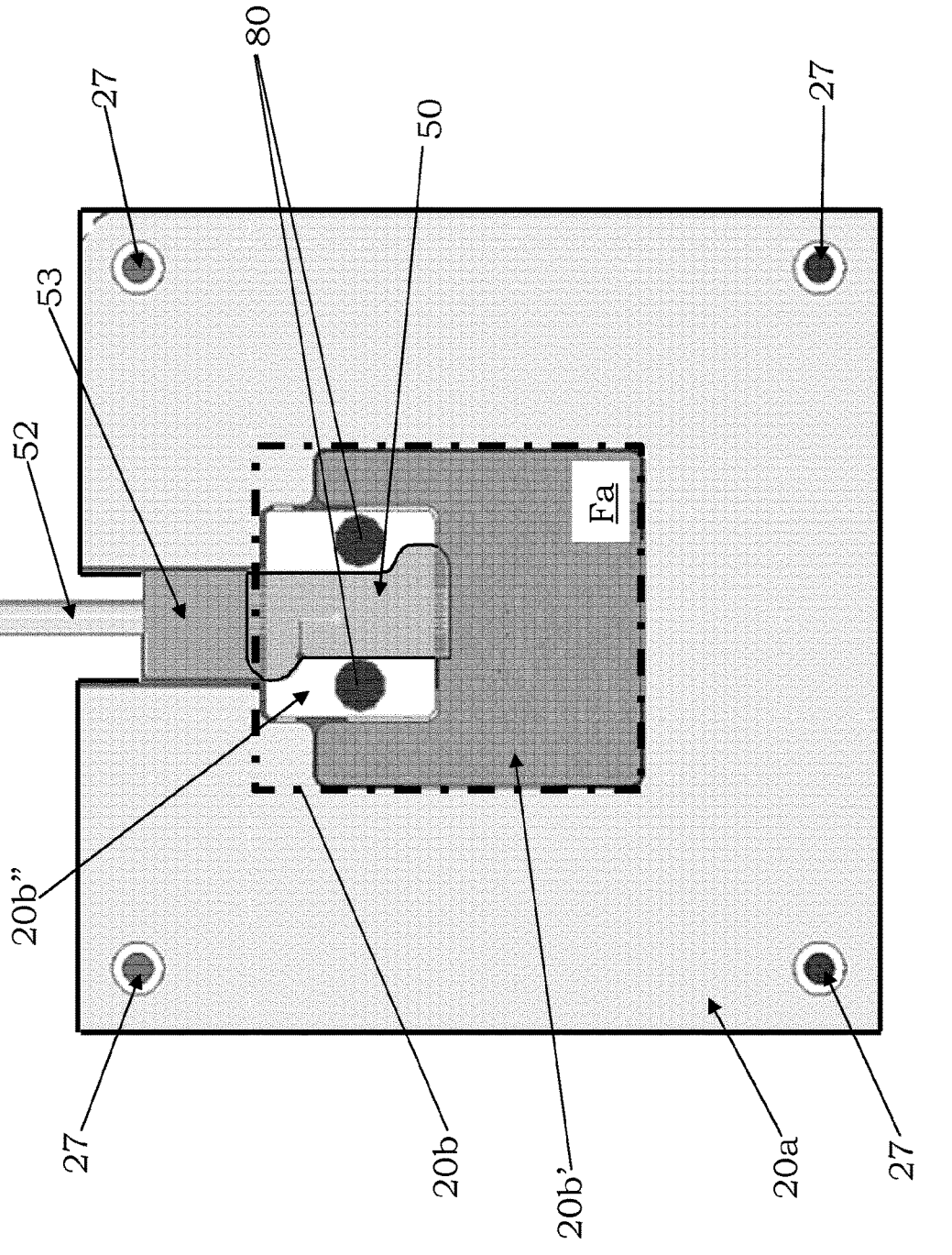
FIG. 6 is a top schematic view which shows details of a lower guide of the probe head of the present invention.

As illustrated in FIG. 4 and as detailed in FIG. 6, in an embodiment of the present invention, the lower guide 20 is not made of a single piece but is at least structured as a first guide portion 20*a*, which is connected to the first portion 40*a* of the containment element 40, and a second guide portion 20*b*, which is connected to the second portion 40*b* of the containment element 40 and is configured to move together with said second portion 40*b*, in particular for the effect of the actuation of the movement means 60. In this way, also the lower guide 20 is provided with a fixed part, that is the first guide portion 20*a* connected to the fixed portion of the containment element 40 (for example via screws 26 passing through holes 27 formed in said first guide portion 20*a*), and with a movable part, that is the second guide portion 20*b* connected to the movable part of said containment element 40 (still via suitable fixing screws).

In an embodiment of the present invention, the second movable guide portion 20*b* in turn comprises a first guide portion 20*b*′, which includes the guide holes 20*h* for housing the contact probes 11, and a second guide structure 20*b*″ adapted to house the test optical signal distribution element 50, said second guide structure 20*b*″ being structurally independent from the first guide structure 20*b*′.

It can be observed that, in the context of the present invention, the term "structurally independent" means that the two guide structure 20*b*′ and 20*b*″ are not initially secured to each other in a fixed way but they maintain an own structural independence, that is they are initially made of two pieces, for example two separated ceramics. The term "structurally independent" thus means that the two guide structures 20*b*′ and 20*b*″ are initially made as separate components.

In this way, the lower guide is divided in three guides: the first guide portion 20*a*, which is fixed (that is fixed to the external frame 40*a* of the containment element 40), the first guide structure 20*b*′ and the second guide structure 20*b*″, which are movable, that is they are fixed to the movable core 40*b* of the containment element 40.

In this embodiment, both said guide structures 20*b*′ and 20*b*″ are then secured to the second portion 40*b* of the containment element 40 and move integrally together. In an embodiment, the first guide structure 20*b*′ is suitably shaped to leave space to house the second guide structure 20*b*″, that is said second guide structure 20*b*″ can be housed at the shaping of the first guide structure 20*b*′.

Figure 7:
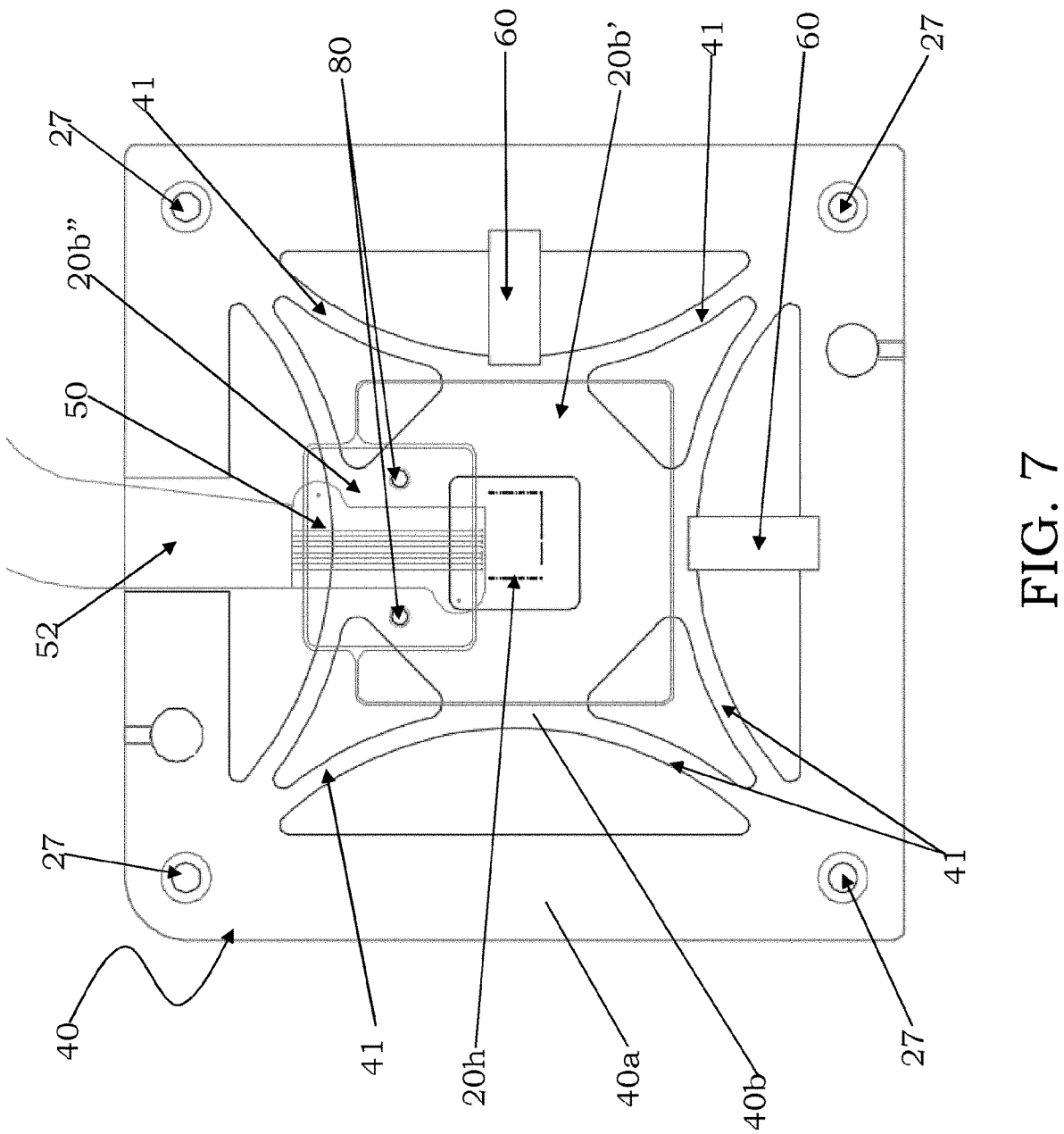
FIG. 7 is a top schematic view of the containment element and of components of the probe head associated thereto.
Figure 8A:
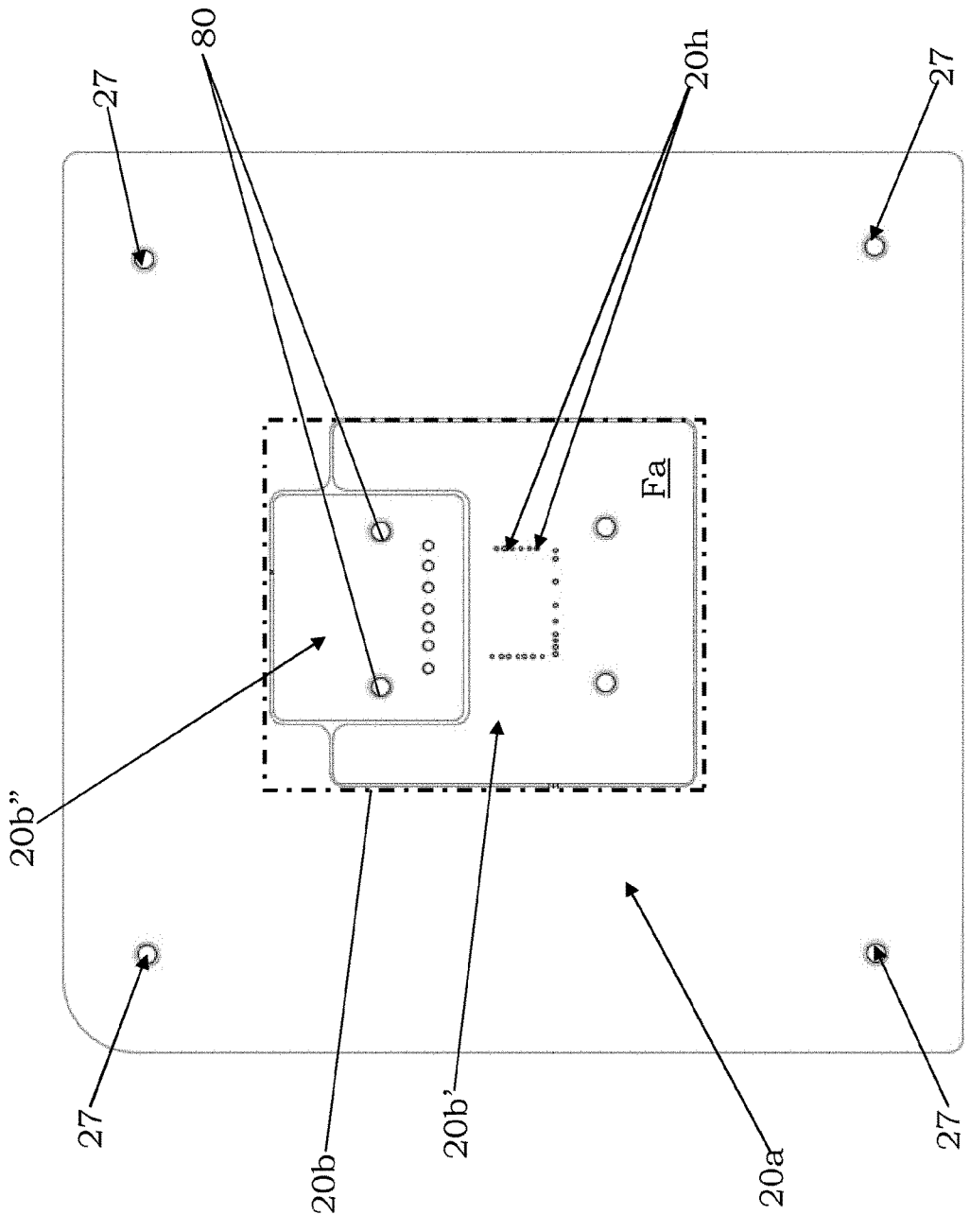
FIG. 8A-8B are schematic views of the lower guide of the probe head according to different embodiments of the present invention.

In other words, referring in particular to FIGS. 6, 7 and to FIG. 8A (which represents a simplified view of FIG. 7 where only the lower guides are displayed), in an embodiment of the present invention the lower guide 20 comprises a static portion (that is the first portion 20*a*) and a dynamic portion. The dynamic portion is represented by the portion 20*b*, which comprises the guide structure 20*b*′ which houses the guide holes 20*h* for the contact probes 11 and the guide structure 20*b*″ which houses the test optical signal distribution element 50, said guide structures thus forming together the second guide portion 20*b*. In this embodiment, the test optical signal distribution element 50 is thus associated to the second guide structure 20*b*″ of the second guide portion 20*b*, so as to be connected to an independent support of the lower guide 20, while the contact probes 11 are associated to the first guide structure 20*b*′ which houses the guide holes 20*h*. In other words, the test optical signal distribution element 50 is connected to its own support ceramic, which facilitates the alignment thereof with respect to the contact probes 11, as will be described in the following.

In this embodiment, the movement elements 60 are adapted to move the second portion 40*b* and thus also the second guide portion 20*b*. In this embodiment, both the first guide structure 20*b*′ and the second guide structure 20*b*″ are moved by the movement means 60, so that the contact probes 11 and the test optical signal distribution element 50 are moved integrally to each other, that is they are subjected to a same displacement. In this way, the optical alignment movement of the test optical signal distribution element 50 causes an analogous movement of the contact probes 11, which does not affect in any way the electric and mechanical contact made by the latter maintaining unaltered the electric and mechanical performances of the probe head 10. The contact probes 11 are thus also associated with the second movable portion 40*b* of the containment element 40 and are arranged to move integrally with said second portion 40*b* and with the test optical signal distribution element 50.

In this embodiment, the first guide portion 20*a*, which is stationary, instead substantially acts as lower covering element of the probe head 10.

Figure 8B:
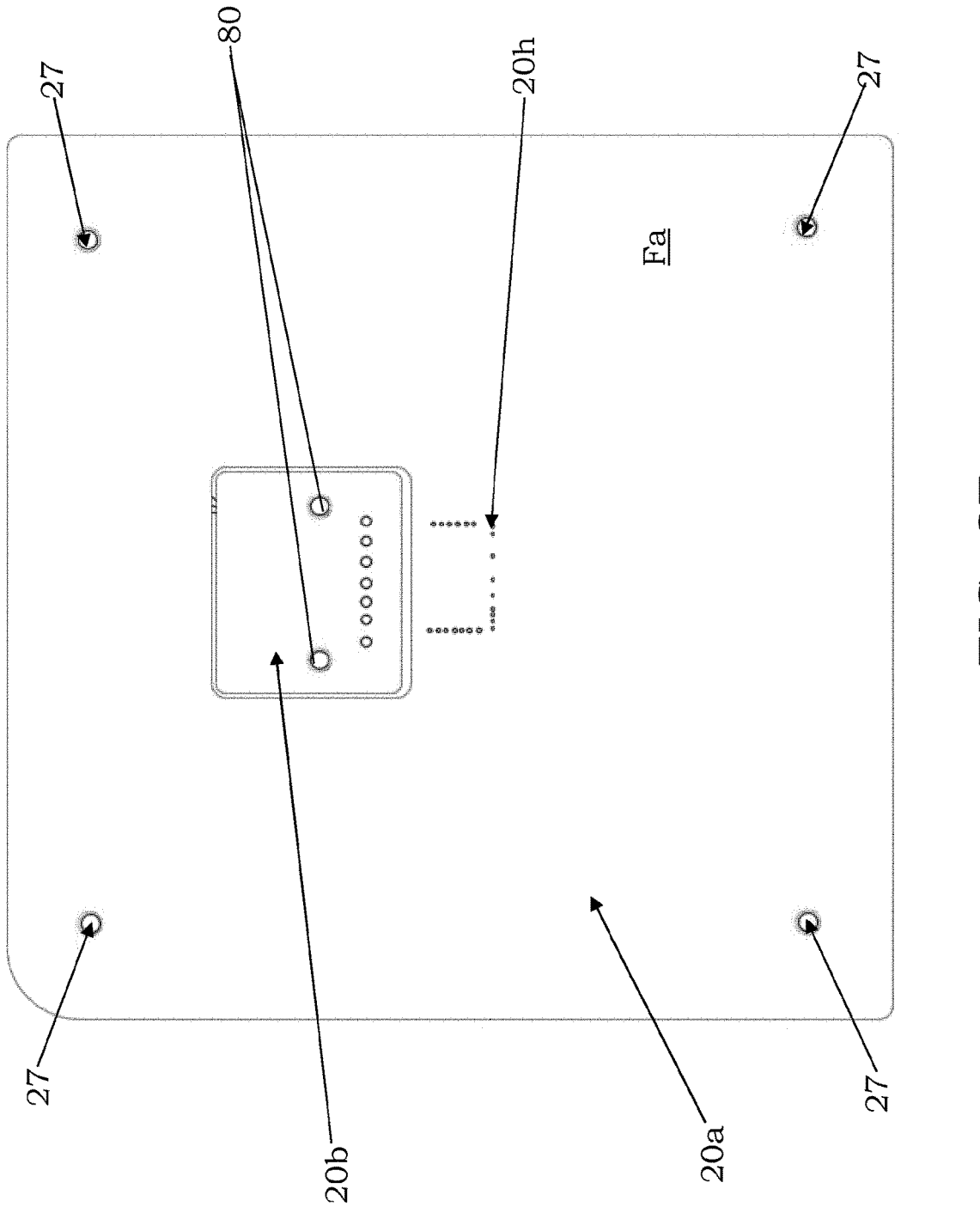

In an alternative embodiment of the present invention, illustrated in FIG. 8B, only the test optical signal distribution element 50 is made to be movable, while the contact probes 11 are always stationary. For example, in the embodiment of FIG. 8B (wherein for the sake of simplicity, only the lower guides are represented), the contact probes 11 are housed in the first guide portion 20*a* (which is secured to the first portion 40*a* of the containment element 40 and comprises the guide holes 20*h*) and the test optical signal distribution element 50 is housed (connected, for example glued) in the second guide portion 20*b* (which is connected to the second portion 40*b*, for example via fixing screws) without further divisions of the lower guide 20. In this case, it can be said that it does no longer exist the first guide structure 20*b*′ which houses the contact probes 11, while the second movable guide portion 20*b* corresponds to the second guide structure 20*b*″, therefore, in this embodiment, reference is made only to first and second guide portions 20*a* and 20*b*. As before, the first guide portion 20*a* is suitably shaped to allow housing the second guide portion 20*b*.

In this embodiment, the contact probes 11 are thus associated with the first portion 40*a* of the containment element 40 and are configured to be stationary during the movement of the second portion 40*b* of said containment element 40. In particular, the contact probes 11 are associated with the first portion 40*a* of the containment element 40 through the first guide portion 20*a*, and the test optical signal distribution element 50 is connected to the second portion 40*b* of said containment element 40 through the second guide portion 20*b*.

The containment element 40 comprises an empty space G at the zone of the guide portion 20*a* where the guide holes 20*h* are present (usually in a central zone), so as to allow suitably housing the contact probes 11.

Other configurations are also possible in which the probe head 10 is configured such that the movement means 60 are adapted to move only the second guide structure 20*b*″, as well as it is possible to also provide cases where the test optical signal distribution element 50 is not associated with a guide but is directly connected to the containment element 40, in particular to the movable portion thereof.

In general, the first guide portion 20*a* thus remains static while the second guide portion 20*b* is made to be dynamic and moved by the movement means 60. In an embodiment, said second guide portion 20*b*, together with the second portion 40*b* of the containment element 40, is the movable central core of the probe head 10 to which the test optical signal distribution element 50 is also fixed. In this way, it is possible to move with accuracy said test optical signal distribution element 50, for example based on a standard spiral routine, in order to obtain the desired optical alignment.

As previously indicated, it is furthermore possible to associate the test optical signal distribution element 50 directly with the containment element 40, so that the guide 20 comprises only the first fixed guide portion 20*a*, even if it is preferable to provide said test optical signal distribution element 50 with an own guide (such as precisely the second guide structure 20*b*″ or more in general the second guide portion 20*b*) so as to facilitate the association thereof and the alignment thereof in the probe head 10.

In an embodiment of the present invention, the upper guide 30 is instead made of a single piece, said single piece comprising the guide holes 30*h* and alignment holes as will be described in the following.

The probe head 10 of the present invention thus comprises a monolithic housing provided with an external frame (that is the first portion 40*a* thereof) for statically fixing to the mechanics of the probe head 10, and with a central movable portion or movable central core (that is the second portion 40*b* thereof) connected to the external frame by flexible and elastically deformable elements, such as the arms 41, which can be in any number and have any form. The second movable portion 40*b* is controlled by the movement means 60 arranged in the housing seats 40*s* formed in the first portion 40*a*.

In an embodiment of the present invention, the movement means 60 comprise at least two piezoelectric transducers, each of said piezoelectric transducers being configured to cause a linear movement in a direction (in particular one of the directions x and y according to the reference system of the figures) of the second portion 40*b* of the containment element 40.

Obviously, also other suitable movement means are comprised in the scope of the present invention, which is not only limited to the piezoelectric transducers, although such an embodiment is considered as being preferred since the piezoelectric transducers allow obtaining a fine adjustment of the movement in a simple way. In an embodiment, the piezoelectric transducers can cause movements of 5 μm with an accuracy of 10 nm.

As illustrated in the attached figures, in an embodiment, the test optical signal distribution element 50 is connected to a face Fa of the lower guide 20, said face Fa facing the device under test 13.

Figures 9A, 9B, 9C:
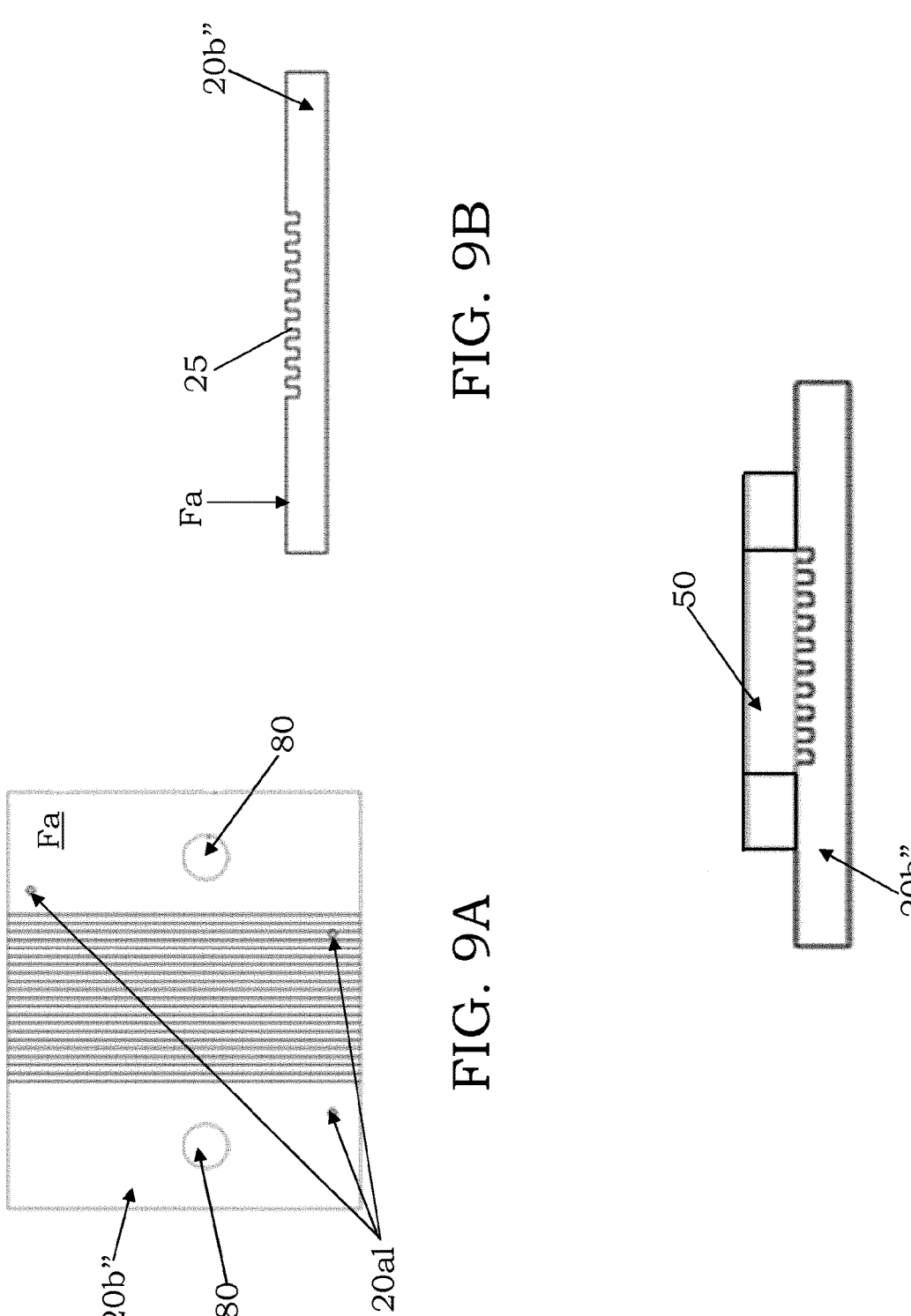
FIGS. 9A-9B show schematic views of a guide structure adapted to support the test optical signal distribution element of the present invention, and the FIG. 9C shows the test optical signal distribution element associated to said guide structure.

In a preferred embodiment of the present invention, the test optical signal distribution element 50 is glued to the lower guide 20, in particular glued to the face Fa thereof. For this reason, with reference to FIGS. 9A-9C, the second guide structure 20*b*″ designated to house the test optical signal distribution element 50 comprises a plurality of grooves 25, the area of the guide occupied by said grooves forming the gluing substrate. The grooves 25 are then filled with resin or other suitable glue 25*g* to allow fixing the test optical signal distribution element 50 to the lower guide 20, in particular to said second guide structure 20*b*″.

Figure 10A:
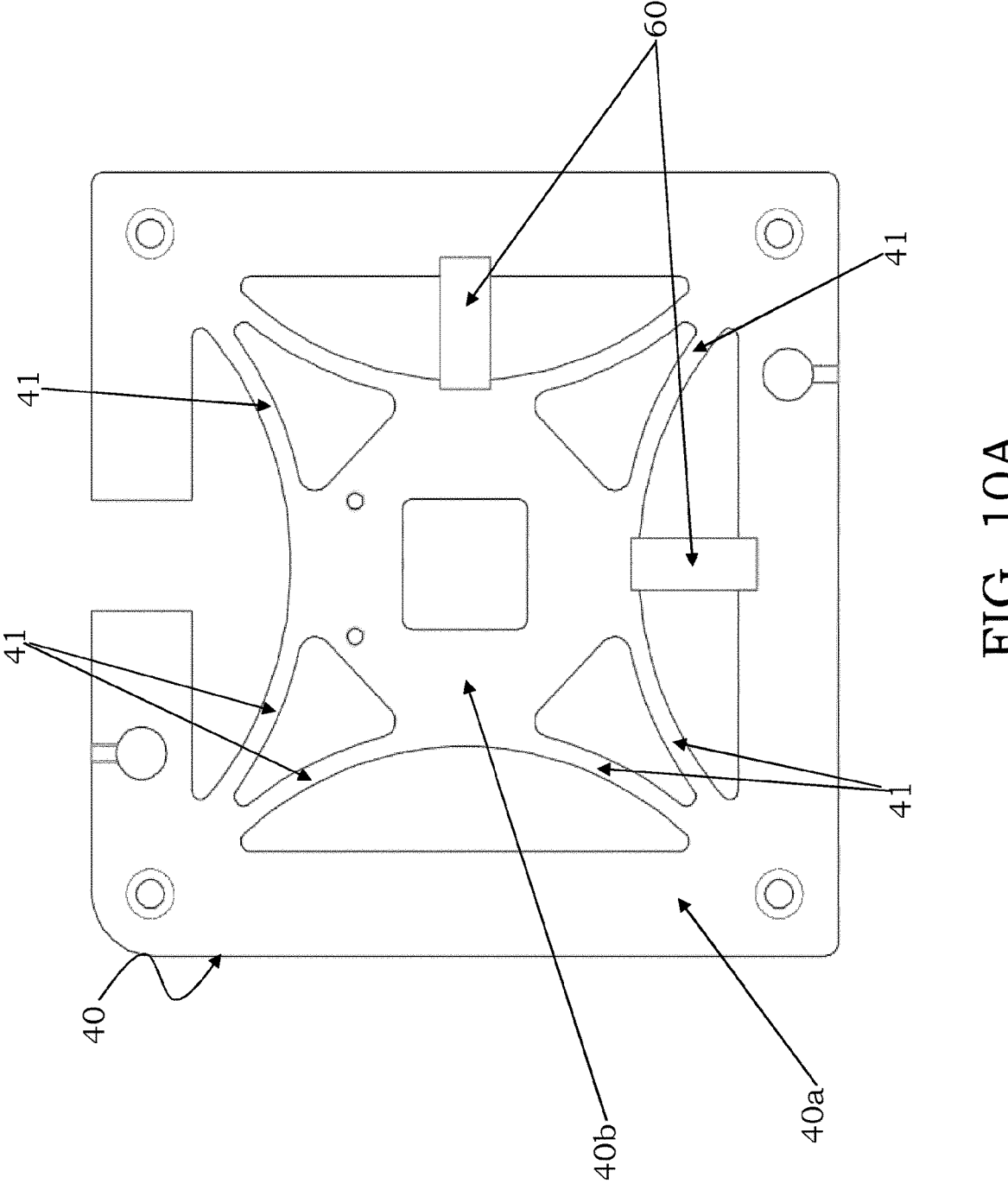
FIGS. 10A-10B schematically show different embodiments of the containment element of the probe head of the present invention.
Figure 10B:
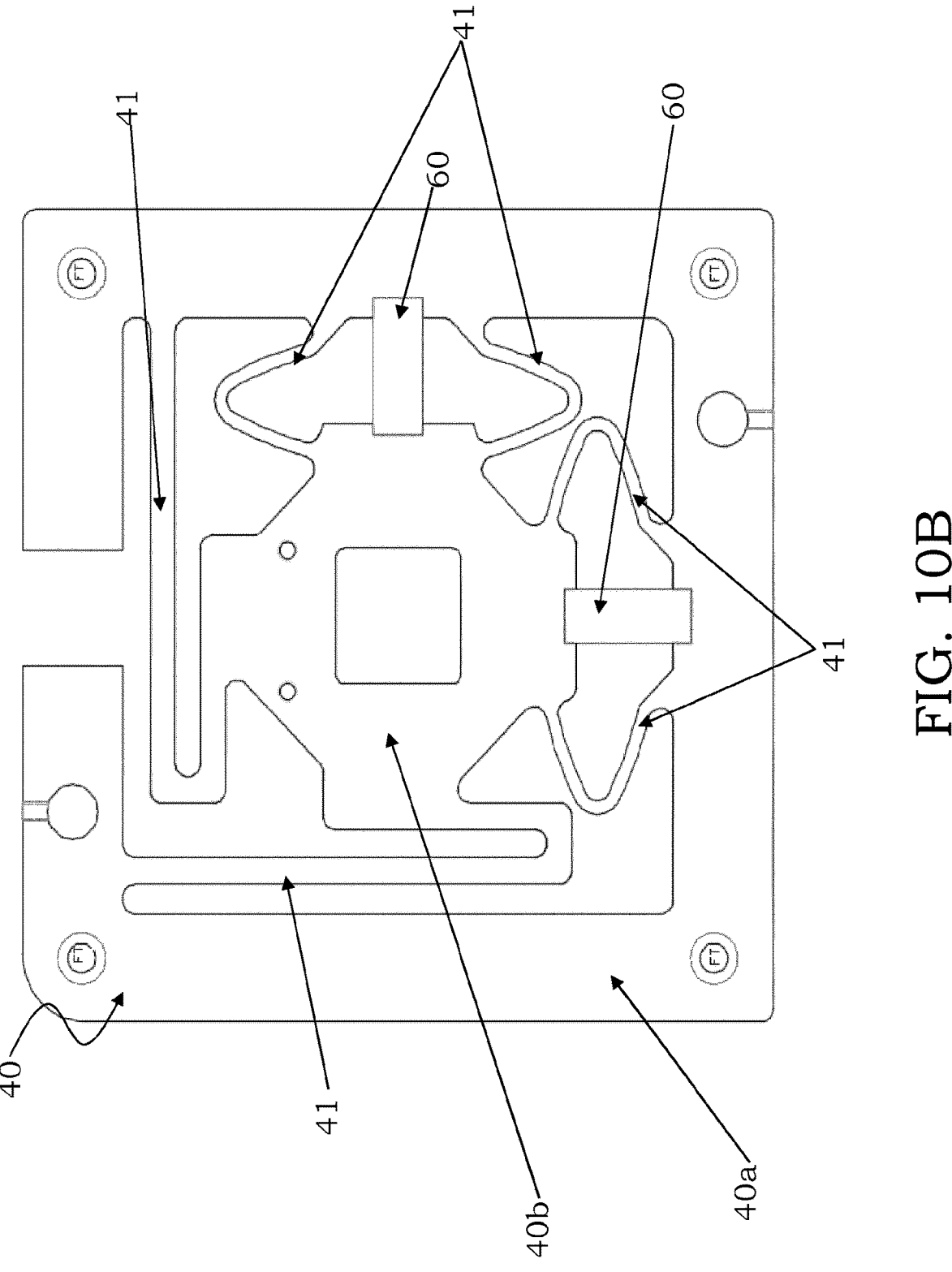

As previously mentioned, the containment element 40 is not limited by a particular form, and various forms different from each other fall within the scope of the present invention. What matters is that said containment element 40 is such as to ensure the mobility of a portion thereof by the movement elements 60 housed therein, for example by a suitable combination of used forms and materials, in particular for the connection arms 41 between the first portion 40*a* thereof and the second portion 40*b* thereof. In this aim, the embodiments of FIGS. 10A and 10B can be compared, which are given only by way of example, which differ from each other because of a different form of the arms 41, which in any case ensure the desired elasticity of the connection between fixed portion and movable portion.

In order to align the test optical signal distribution element 50 with respect to the contact probes 11, and thus in order to precisely adapt the probe head 10 to the layout of the device under test, an efficient alignment system is provided which can be easily used in a assembly step of said probe head 10.

Figure 11A:
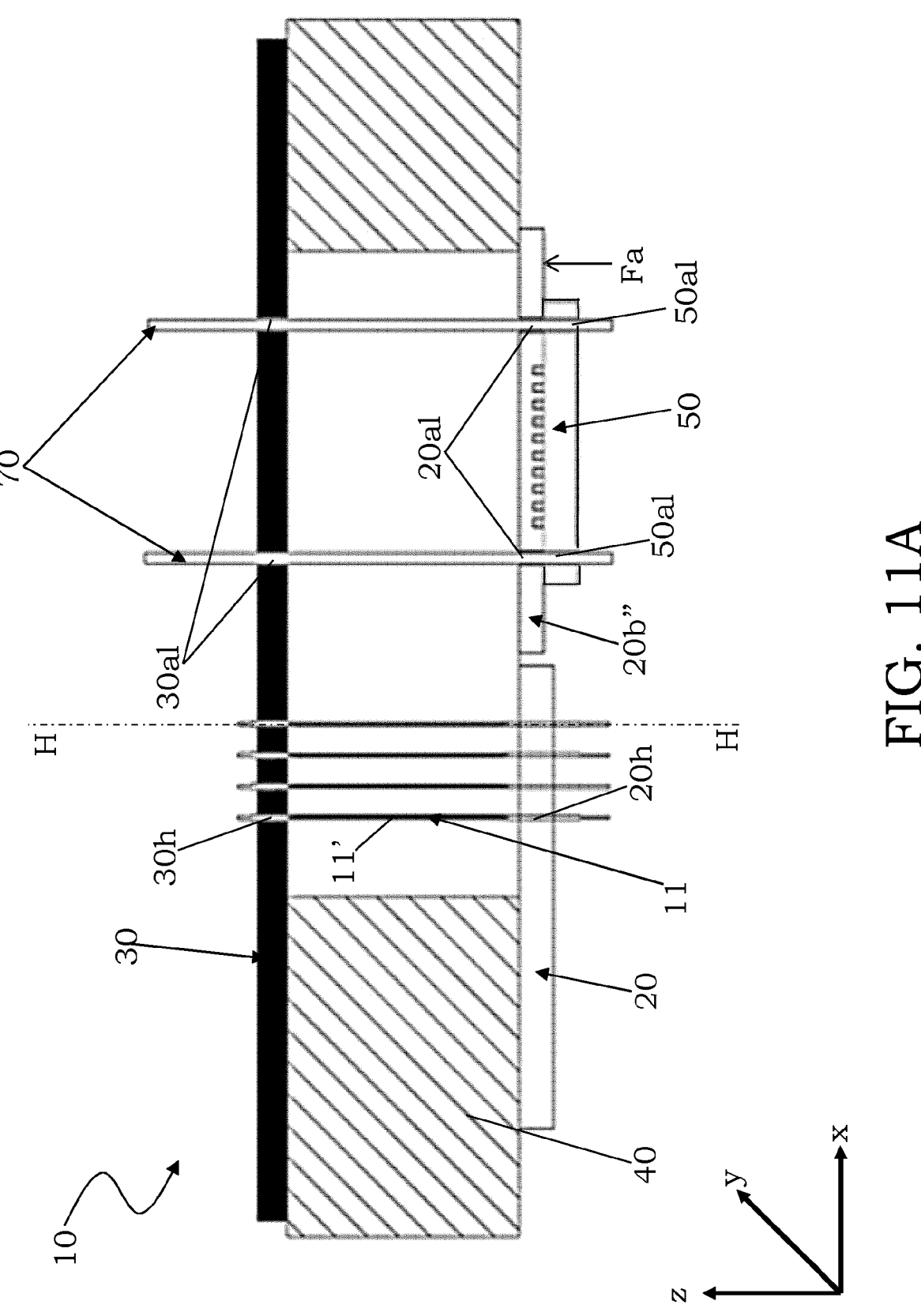
FIG. 11A schematically shows an embodiment of the probe head of the present invention.
Figure 11B:
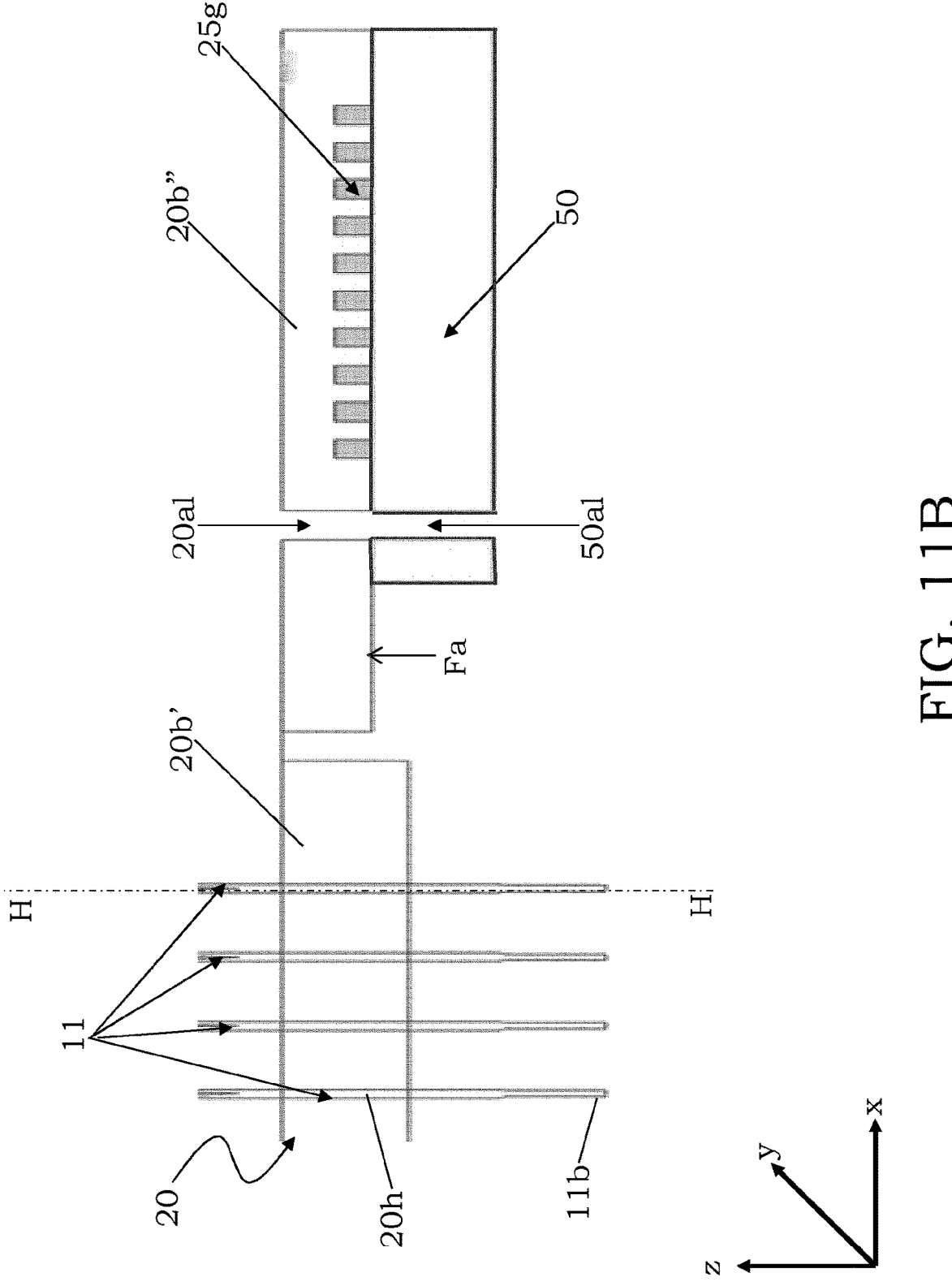
FIG. 11B shows a detail of the probe head of FIG. 11A.

In particular, referring now to FIGS. 11A and 11B, the test optical signal distribution element 50 suitably comprises first alignment holes 50*a*1, the second guide structure 20*b*″, which is structurally independent from the first guide structure 20*b*′, comprises second alignment holes 20*a*1, and the upper guide 30 comprises corresponding third alignment holes 30*a*1.

Suitably, the alignment holes 20*a*1, 30*a*1 and 50*a*1 are arranged and configured to allow, when the centres of the alignment holes of respective components are aligned along a same predetermined axis, in particular along a vertical axis parallel to the axis H-H, the passage of alignment pins or pin 70 to ensure the reciprocal alignment between the contact probes 11 housed in the first guide structure 20*b'* and the test optical signal distribution element 50 connected to the second guide structure 20*b"* of the lower guide 20.

In other words, when the respective alignment holes of the lower guide 20 (in particular of the second guide structure 20*b"*), of the test optical signal distribution element 50 and of the upper guide 30 are aligned to each other along a determined axis (and said alignment is obtained by inserting the alignment pins 70), the precise alignment and positioning (in particular in the plane x-y) of the test optical signal distribution element 50 in the probe head 10 is obtained, which can be thus fixed to the containment element, for example via suitable fixing screws.

As previously mentioned, the upper guide 30 is made of a single piece. In this way, the upper guide 30 houses, in a single piece, both the guide holes 30*h* designated to house the contact probes 11 and the alignment holes 30*a*1.

In this way it is possible to obtain in a simple way a precise reciprocal alignment between the test optical signal distribution element 50 and the guide holes 20*h* which houses the contact probes 11, passing from a routine of spatial search of 20-50 µm to a search with maximum amplitude of 5 µm or even less.

In other words, the alignment holes 20*a*1, 30*a*1, and 50*a*1 are arranged and configured to allow, when the centres of the alignment holes 50*a*1 of the test optical signal distribution element 50 are aligned along a respective predetermined axis (for example vertical) with centres of corresponding alignment holes 20*a*1 of the second guide portion 20*b* and with centres of corresponding alignment holes 30*a*1 of the upper guide 30, the passage of the alignment pins 70 to ensure reciprocal alignment between the contact probes 11 and the distribution element of the test optical signal 50. The alignment holes in which a single pin 70 passes thus form a group of corresponding aligned alignment holes.

In an embodiment of the present invention, the alignment holes are obtained by laser drilling with accuracy less than 3 µm, so that the alignment accuracy is also very high.

Once the alignment pins 70 are inserted in all the specific alignment holes, the test optical signal distribution element 50 is thus perfectly aligned with respect to all the other components of the probe head 10. Once aligned, the test optical signal distribution element 50, in particular the support to which it is glued, is fixed to the containment element 40 via tightening screws passing through respective tightening holes 80 formed in the lower guide. As mentioned above, the potential alignment error between these components of the probe head 10 is equal to the accuracy of the forming process of alignment holes, for example via laser, generally lower than 3 µm, and thus very low, thus minimizing the subsequent optical alignment routine of the test optical signal distribution element 50.

Figure 12:
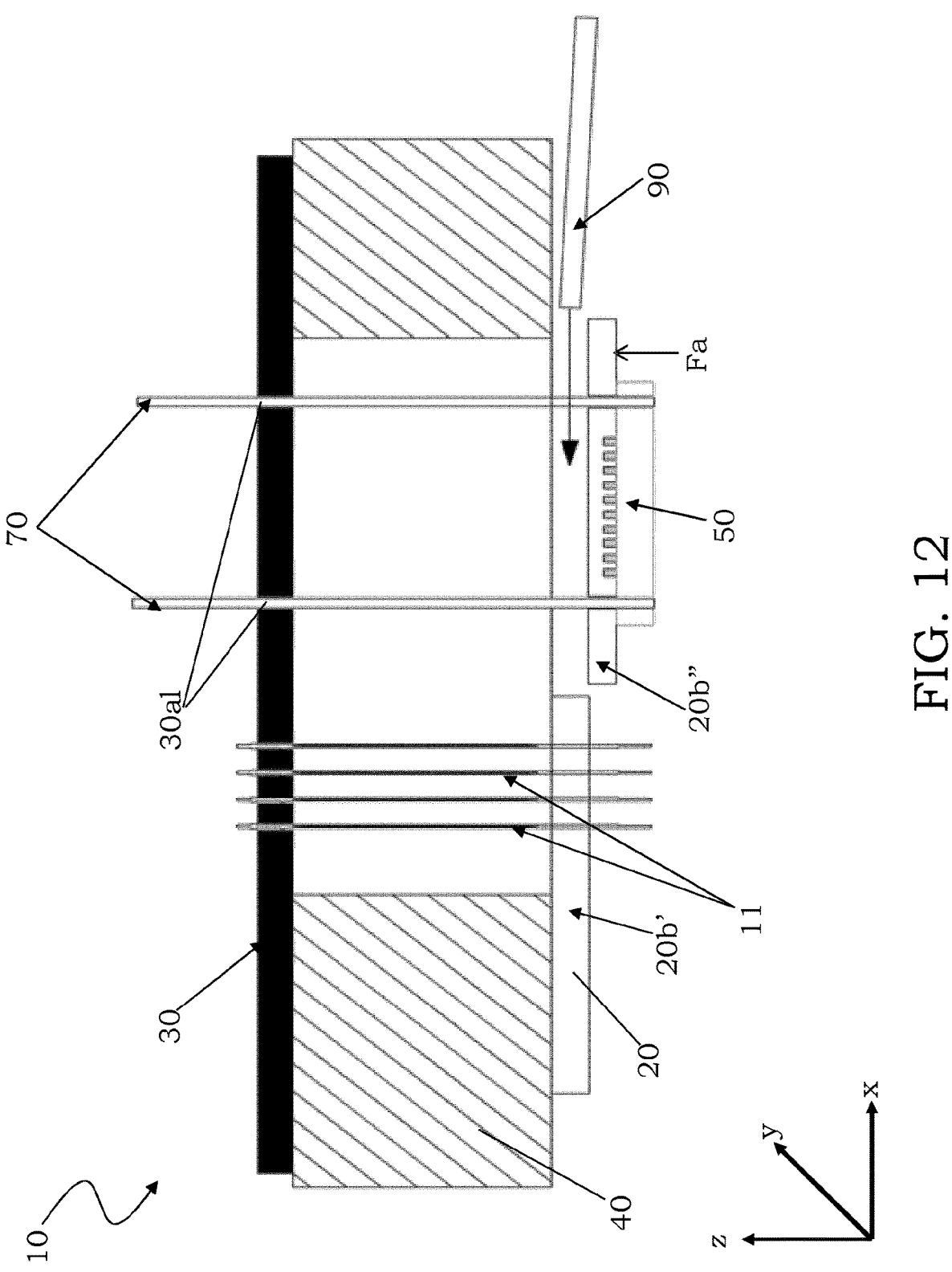
FIG. 12 schematically shows an embodiment of the probe head of the present invention including a spacer element.

Furthermore, in order to ensure the precise positioning along the vertical axis, that is along the axis z according to the reference system of the figures, in an embodiment of the present invention, at least one spacer element 90 arranged between the containment element 40 and the second guide structure 20*b"* is provided, said spacer element 90 being removable to allow the adjustment of the distance between the test optical signal distribution element 50, e thus the outlets of the waveguides, and the device under test 13. FIG. 12 shows the probe head 10 including a single spacer element 90, even if any suitable number of spacer elements 90, of any suitable form, can be obviously used.

By way of example, the spacer element 90 can be made of steel or a polyamide material, even if other materials are obviously possible.

The spacer elements 90 thus represent calibrated thicknesses (for example from 25 or 30 µm) arranged between the containment element 40 and the lower guide 20, which can be removed if needed to ensure the adjustment of the distance along the axis z as indicated above.

It is furthermore possible to carry out a further vertical fine calibration by calibrated lapping of the contact probes 11.

Thanks to the vertical calibration above illustrated, the distance between the outlet of the waveguides is substantially equal to the positioning requirement of the test optical signal distribution element 50 plus the working overdrive.

To conclude, the present invention provides a probe head with vertical probes comprising a pair of guides between which is arranged a containment element (also called housing) of the vertical probes, wherein the vertical probes head technology is combined with the presence of optical elements, in particular waveguides, inside the probe head, in particular associated to the lower guide, to carry out the test of devices including integrated photonic circuits, wherein the optical elements are integrated inside the probe head forming a simple and compact structure. In particular, the containment element is provided with a fixed portion (for example an external frame) and a movable portion (for example the central core) to which at least the waveguides for the optical test are connected via a designated ceramic support and simple movement means are present, such as for example piezoelectric transducers, to move said movable portion and obtain a fine and precise alignment of the optical elements with respect to the optical interfaces of the device under test. In this way, both the contact probes and the waveguides are associated with a same containment element of the probe head, wherein the movement of the movable portion of the containment element is only required to obtain the optical alignment, obtaining a structure which is compact and allows the use of vertical probes housed in the guides and in the containment element. The designed architecture further allows a simple relative alignment between contact probes and optical elements, by simply moving the ceramic support of the waveguides, as well as a simple adjustment of the distance in the vertical direction.

It is thus possible to test optoelectronic devices via vertical probes, without the aid of complicated and expensive precision mechanics.

Advantageously according to the present invention, an optoelectronic probe head is obtained which includes optical components for the optical testing of a device and which allows an extremely simplified alignment of said optical components, wherein all the components are integrated in a compact structure which allows to use vertical probes.

In particular, suitably, the optical elements integrated in the probe head are associated with the containment element of the same, obtaining an extremely compact structure, without needing to introduce specific mechanical support arms to hold and move said optical elements, thus simplifying the mechanical structure of the probe head and optimizing the spaces.

The alignment of the waveguides with respect to the optical interfaces of the device under test is really simple and requires only the movement of the movable portion of the housing for example by means of a pair of piezoelectric transducers, without having to resort to expensive mechanics and without renouncing to the simplicity and compactness of the overall structure.

Suitably, as mentioned above, the probe head of the present invention houses vertical contact probes, that is contact probes having a substantially vertically extended body, which slide in guide holes of at least one guide and adapted to flex while in contact with the device under test, usually having both ends free. It is thus possible for example to use very short contact probes to limit the self-inductance phenomenon and thus to carry out tests of high-frequency devices (for example carry out an electric test up to GHz of frequency), as well as there is more freedom in choosing the layout, obtaining highly improved performances.

Also the relative alignment between contact probes and optical components is very precise and simple, thanks to the possibility to move the support of such optical components before fixing the same having as reference the alignment holes.

The excellent reciprocal alignment between probes and waveguides implies a short optical coupling routine, which gives a considerable advantage on the testing time.

Also the possibility of precisely calibrating the vertical distance between the optical element and the device under test is added to all the above.

The probe head of the present invention puts thus together a compact structure and the ease and stability of the alignment in all the space directions, both of the optical components with respect to the device under test, and of said optical components with respect to the contact probes designated for the electric test.

The described probe head thus resolves the technical problem of the present invention and achieves all the various above-mentioned advantages.

An important application of the probe head of the present invention is in the field of data centres, which require a fast data transmission and reduced energy consumption.

Obviously, a person skilled in the art, in order to meet contingent and specific needs, can make numerous modifications and variations to the above-described probe head, all of which are included in the scope of protection of the invention as defined by the following claims.

The invention claimed is:

1. A probe head for a testing apparatus of electronic devices, comprising:
   a plurality of contact probes adapted to electrically and mechanically contact contact pads of a device under test;
   at least one guide provided with a plurality of guide holes for slidingly housing the contact probes;
   a containment element which is adapted to support the guide and houses at least one portion of the contact probes, wherein the containment element comprises a first portion and a second portion which is movable with respect to the first portion;
   movement means configured to move the second portion of the containment element with respect to the first portion; and
   at least one test optical signal distribution element configured to transmit a test optical signal to the device under test,
   wherein the test optical signal distribution element is associated with the second portion of the containment element and is arranged to be moved integrally therewith by means of the movement means, said movement means being configured to allow the alignment of the test optical signal distribution element.

2. The probe head according to claim 1, wherein the guide is structured as a first guide portion, which is connected to the first portion of the containment element, and a second guide portion, which is connected to the second portion of the containment element and is configured to move together with the second portion of the containment element.

3. The probe head according to claim 1, wherein the contact probes are associated with the first portion of the containment element the contact probes being configured to be stationary during the movement of the second portion of the containment element.

4. The probe head according to claim 3, wherein the guide is structured as a first guide portion, which is connected to the first portion of the containment element, and a second guide portion, which is connected to the second portion of the containment element and is configured to move together with the second portion of the containment element, and wherein the contact probes are associated with the first portion of the containment element through the first guide portion, and wherein the test optical signal distribution element is associated with the second portion of the containment element through the second guide portion.

5. The probe head according to claim 1, wherein the contact probes are also associated with the second portion of the containment element and are arranged to move integrally with the second portion and with the test optical signal distribution element.

6. The probe head according to claim 5, wherein the guide is structured as a first guide portion, which is connected to the first portion of the containment element, and a second guide portion, which is connected to the second portion of the containment element and is configured to move together with the second portion of the containment element, and wherein the second guide portion in turn comprises a first guide structure, which includes the guide holes for housing the contact probes, and a second guide structure adapted to house the test optical signal distribution element, the second guide structure being structurally independent from the first guide structure.

7. The probe head according to claim 1, wherein the movement means comprise at least two piezoelectric transducers, each of said piezoelectric transducers being configured to cause a linear movement of the second portion of the containment element in a specific direction.

8. The probe head according to claim 1, wherein the contact probes comprise a body extending vertically along a longitudinal axis between a first end and a second end, the first end being adapted to contact an interface board interfaced with the probe head, and the second end being adapted to contact the contact pads of the device under test.

9. The probe head according to claim 1, wherein the test optical signal distribution element is connected to a face of the guide facing the device under test.

10. The probe head according to claim 9, wherein the test optical signal distribution element is glued to the face of the guide.

11. The probe head according to claim 1, wherein the guide is a lower guide and the probe head further comprises an upper guide, wherein the containment element is arranged between the lower guide and the upper guide.

12. The probe head according to claim 11, wherein the guide is structured as a first guide portion, which is connected to the first portion of the containment element, and a second guide portion, which is connected to the second portion of the containment element and is configured to move together with the second portion of the containment element, and wherein the test optical signal distribution element comprises first alignment holes, the second guide portion of the lower guide comprises second alignment holes, and the upper guide comprises third alignment holes, said first alignment holes, second alignment holes and third alignment holes being arranged and configured to allow, when the centres of the first alignment holes of the test optical signal distribution element are aligned along a respective predetermined axis with centres of corresponding second alignment holes of the second guide portion and with centres of corresponding third alignment holes of the upper guide, the passage of alignment pins to ensure reciprocal alignment between the contact probes and the test optical signal distribution element connected to the second guide portion of the lower guide.

13. The probe head according to claim 12, wherein the alignment holes are obtained by laser drilling with an accuracy less than 3 μm.

14. The probe head according to claim 11, wherein the upper guide is made of a single piece.

15. The probe head according to claim 1, wherein the test optical signal distribution element comprises a glass or plastic body and a plurality of waveguides which are formed in the glass or plastic body and are configured to guide light from a light source towards the device under test.

16. The probe head according to claim 1, wherein the test optical signal distribution element is configured to couple light via a grating coupler of an optical interface of the device under test.

17. The probe head according to claim 1, comprising at least one spacer element arranged between the containment element and the guide, the spacer element being removable to allow adjusting the distance between the test optical signal distribution element and the device under test.

18. The probe head according to claim 1, wherein the containment element comprises at least one deformable arm which connects its first portion and its second portion to each other.

19. The probe head according to claim 1, wherein the first portion of the containment element is a peripheral portion thereof, and the second portion of the containment element is a central portion thereof.

* * * * *